United States Patent [19]
Havel

[11] Patent Number: 5,963,185
[45] Date of Patent: Oct. 5, 1999

[54] DISPLAY DEVICE WITH VARIABLE COLOR BACKGROUND AREA

[75] Inventor: Karel Havel, Bramalea, Canada

[73] Assignee: Texas Digital Systems, Inc., College Station, Tex.

[21] Appl. No.: 08/721,719

[22] Filed: Sep. 27, 1996

Related U.S. Application Data

[62] Division of application No. 08/422,090, Mar. 31, 1995, Pat. No. 5,561,365, which is a division of application No. 08/099,411, Jul. 30, 1993, abandoned, which is a division of application No. 07/767,792, Sep. 30, 1991, abandoned, which is a division of application No. 07/528,229, May 24, 1990, Pat. No. 5,057,768, which is a division of application No. 07/337,410, Apr. 13, 1989, abandoned, which is a division of application No. 06/940,100, Dec. 10, 1986, Pat. No. 4,831,326, which is a continuation-in-part of application No. 06/882,430, Jul. 7, 1986, Pat. No. 4,734,619.

[30] Foreign Application Priority Data

Jan. 14, 1987 [CA] Canada ..................................... 527300
Dec. 4, 1987 [CA] Canada ..................................... 553534

[51] Int. Cl.$^6$ ........................................................ G08B 5/38
[52] U.S. Cl. ............................. 345/83; 345/34; 345/39; 345/114
[58] Field of Search ................................ 345/34, 35, 39, 345/44, 82, 83, 114

[56] References Cited

U.S. PATENT DOCUMENTS

| | | | |
|---|---|---|---|
| 3,760,174 | 9/1973 | Boenning et al. | 240/1 R |
| 3,911,418 | 10/1975 | Takeda | 345/114 |
| 4,559,480 | 12/1985 | Nobs | 315/324 |
| 4,689,613 | 8/1987 | Ikeda | 345/114 |
| 4,740,818 | 4/1988 | Tsilibes et al. | 355/14 R |
| 5,561,365 | 10/1996 | Havel | 324/115 |

FOREIGN PATENT DOCUMENTS

| | | | |
|---|---|---|---|
| 0220844 | 4/1985 | German Dem. Rep. | 345/83 |
| 357146112 | 9/1982 | Japan | 345/83 |

OTHER PUBLICATIONS

Wagner, B., "2–Color LED + Driver =Versatile Visual Effects", EDN vol. 25, No. 19, Oct. 20, 1980.

Smithline, L.M., "Dual light emitting diode synthesizes polychromatic light", Electronics, Aug. 16, 1979, p. 130.

Svestka, M. et al, "LED's change color to indicate balance voltage", Electronic Engineering, vol. 48, No. 576, p. 19, Feb. 1976.

Saitoh, T. et al. "Multi–color light emitting diodes with double junction structure". IEEE Transactions on Electron Devices, Feb. 1975, vol. ED–22, No. 2, pp. 29–32.

Yamaguchi, T. et al., "a High Brightness Gap Multicolor LED", IEEE Transactions on Electron Devices, vol. ED–28, No. 5, May 1981, p. 588–592.

Baker, M., "Chip changes the color of light emitting diodes", Electronics, Apr. 7, 1981, pp. 158–159.

Rao, V., Two LED's blend and blink to indicate six states. Electronic Design, vol. 30, No. 16, p. 220, Aug. 5, 1982.

Kojima, T. "Recent flat panel development in Japan", held in San Diego, CA, 29 Apr. —1 May, 1980. SID 80 Digest, pp. 22–23.

Niina, T. et al., "A multi–color GaP LED flat panel display device" Held New York, NY, USA, Apr. 28–30, 1981. 1981 SID International Symposium Digest of Papers, vol. XII (1981), pp. 140–141.

Niina, T. et al., "A multi–color LED flat panel display device for colorful displays of letters and figures". Proceedings of the SID, vol. 23, No. 2, pp. 73–76, 1982.

O'Mara, P.A. et al., "Microprocessor–controlled light emitting diode dark adaptometer". Medical & Biological Engineering and Computing, vol. 20, No. 1, pp. 70–76, 1982.

Primary Examiner—Richard A. Hjerpe
Assistant Examiner—M. Fatahiyar
Attorney, Agent, or Firm—Akin, Gump, Strauss, Hauer & Feld, L.L.P.

[57] ABSTRACT

A display device includes a display area, for exhibiting a display unit, substantially surrounded by a variable color background area, which includes a color control input for uniformly controlling its color. The variable color background area includes a plurality of multi-color light emitting diodes arranged in a pattern, which are coupled to the color control input for being illuminated in a selective uniform color in accordance with a color control signal.

3 Claims, 6 Drawing Sheets

DISPLAY DEVICE WITH VARIABLE COLOR BACKGROUND AREA

CROSS-REFERENCE TO RELATED APPLICATIONS

This is a division of my application Ser. No. 08/422,090, filed on Mar. 31, 1995, entitled Digital Color Display System, now U.S. Pat. No. 5,561,361, which is a division of my application Ser. No. 08/099,411, filed on Jul. 30, 1993, entitled Method of Measuring and Indicating, now abandoned, which is a division of my application Ser. No. 07/767,792, filed on Sep. 30, 1991, entitled Method of Measuring and Indicating, now abandoned, which is a division of my application Ser. No. 07/528,229, filed on May 24, 1990, entitled Measuring Device with Variable Color Display, now U.S. Pat. No. 5,057,768 issued on Oct. 15, 1991, which is a division of my application Ser. No. 07/337,410, filed on Apr. 13, 1989, entitled Digital Voltmeter with Variable Color Background, now abandoned, which is a division of my application Ser. No. 06/940,100, filed on Dec. 10, 1986, entitled Digital Voltmeter with Variable Color Background, now U. S. Pat. No. 4,831,326 issued on May 16, 1989, which is a continuation-in-part of my application Ser. No. 06/882,430, filed on Jul. 7, 1986, entitled Display Device with Variable Color Background, now U. S. Pat. No. 4,734,619 issued on Mar. 29, 1988.

This also relates to my application Ser. No. 06/922,847, filed on Oct. 24, 1986, entitled Continuously Variable Color Display Device, now U.S. Pat. No. 4,845,481 issued on Jul. 4, 1989, to my application Ser. No. 07/322,341, filed on Mar. 13, 1989, entitled Continuously Variable Color Optical Device, now U. S. Pat. No. 4,965,561 issued on Oct. 23, 1990, and to my application Ser. No. 06/929,625, filed on Nov. 12, 1986, entitled Variable Color Digital Display Device, now U. S. Pat. No. 4,771,274 issued on Sep. 13, 1988.

BACKGROUND OF THE INVENTION

1. Field of the Invention

This invention relates to a variable color display device.

2. Description of the Prior Art

Commercially available display devices with monochromatic digital readout are capable of displaying digital values at a relatively fast rate. However, to determine a significance of each displayed value, an operator must rapidly read displayed values and perform mental comparisons with predetermined limits. The task is much more complicated when the limits are variable.

A light emitting diode display, disclosed in U. S. Pat. No. 4,488,149, issued on Dec. 11, 1984 to William A. Givens, Jr, is capable of displaying digits in two different colors, in accordance with different color control signals.

A driving circuit for light emitting diodes, described in U. S. Pat. No. 3,740,570 issued on Jun. 19, 1973 to George R. Kaelin et al., utilizes special light emitting diodes that emit light of different colors in response to different currents.

A method and apparatus for independent color control of alphanumeric display and background therefor are disclosed in U. S. Pat. No. 3,911,418, issued on Oct. 7, 1975 to Minoru Takeda. In order to exhibit a character in a desired color, the code of the character and its color code are entered from a keyboard. A color code for the background area is then entered from the keyboard, independently of the color code for the displayed character. All entered codes are then encoded into a composite train of pulses, which are then separated, decoded, and used for exhibiting on a cathode ray tube display device the desired character in the desired color, and for controlling color of its background.

SUMMARY OF THE INVENTION

Accordingly, it is the principal object of this invention to provide a display device for facilitating prompt recognition of significance of a displayed value.

It is another object of the invention to provide an improved display device including a variable color background area.

It is still another object of the invention to provide a display device with variable color background area having a common color control input.

In summary, a display device of the invention includes a display area, for exhibiting a display unit, substantially surrounded by a variable color background area, which includes a plurality of light emitting diodes for emitting light signals of different colors. Color control input is coupled to the light emitting diodes for selectively biasing them, in accordance with a color control signal applied to the color control input, to illuminate the background area in a selective uniform color.

Further objects of the invention will become obvious from the accompanying drawings and their description.

The principles of the display device with variable color background area of the invention are illustrated by the example of a digital voltmeter with variable color display.

BRIEF DESCRIPTION OF THE DRAWINGS

In the drawings in which are shown the preferred embodiments of the invention.

Throughout the drawings, like character indicate like parts.

Description of the Preferred Embodiments

Figure 1:
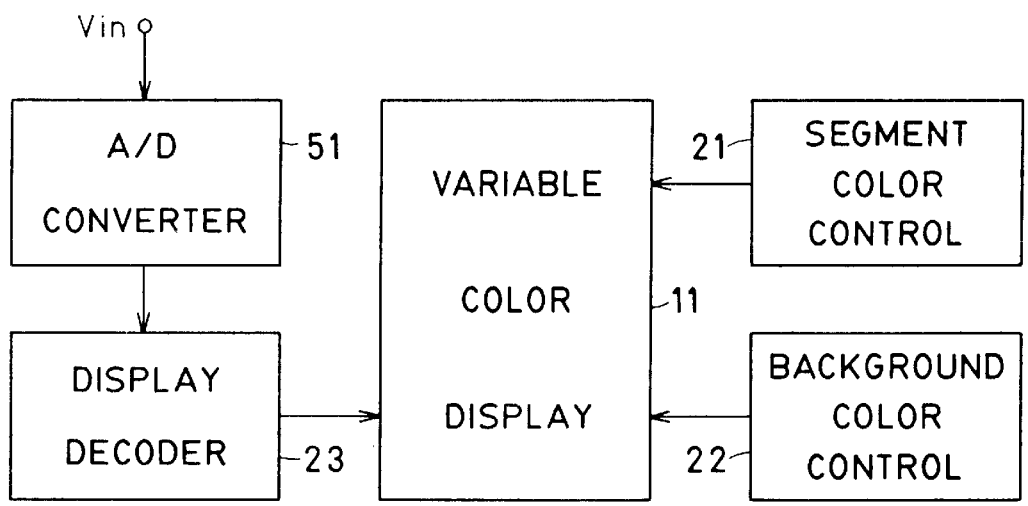
FIG. 1 is a block diagram of a digital voltmeter with a variable color display.

Referring now, more particularly, to the drawings, in FIG. 1 is shown a block diagram of a digital voltmeter utilizing a variable color display surrounded by a variable color background area. The digital voltmeter includes an A/D (analog to digital) converter 51, for converting an analog signal Vin applied to its input to digital data, and a display decoder 23 for causing the digital data to be displayed in a character format on a variable color display 11, in a manner well known to those skilled in the art. As will be more specifically pointed out subsequently, the display 11 includes variable color display areas arranged in a pattern and surrounded by an integral variable color background area. The invention resides in the addition of a segment color control 21 and a background color control 22 for illuminating display 11 in a color related to the measured value. The digital voltmeter of this invention can thus simultaneously indicate the measured value, in a character format, and its significance, in a color of the display. By way of an example, measured value that is considered to be normal may be indicated in green color, measured value that is slightly abnormal may be indicated in blue color, and measured value that is critical may be indicated in red color.

Figure 2:
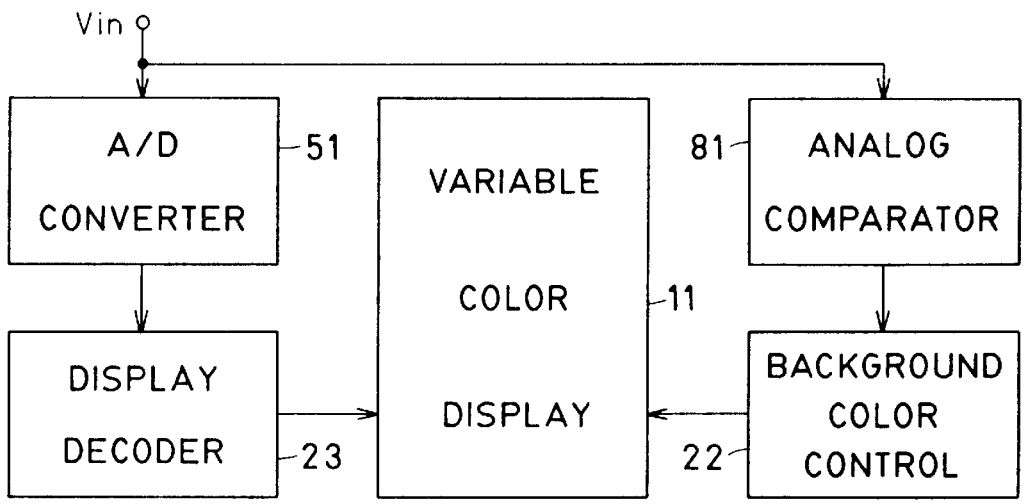
FIG. 2 is a block diagram of a variable color digital voltmeter with an analog comparator.

In FIG. 2 is shown a block diagram of a like digital voltmeter characterized by an analog comparator 81. The input of analog comparator 81 is coupled to the input of A/D converter 51 for comparing an input signal with predetermined limits and for developing comparison signals accordingly. The background color control 22 illuminates the background area of display 11 in accordance with the comparison signals.

Figure 3:
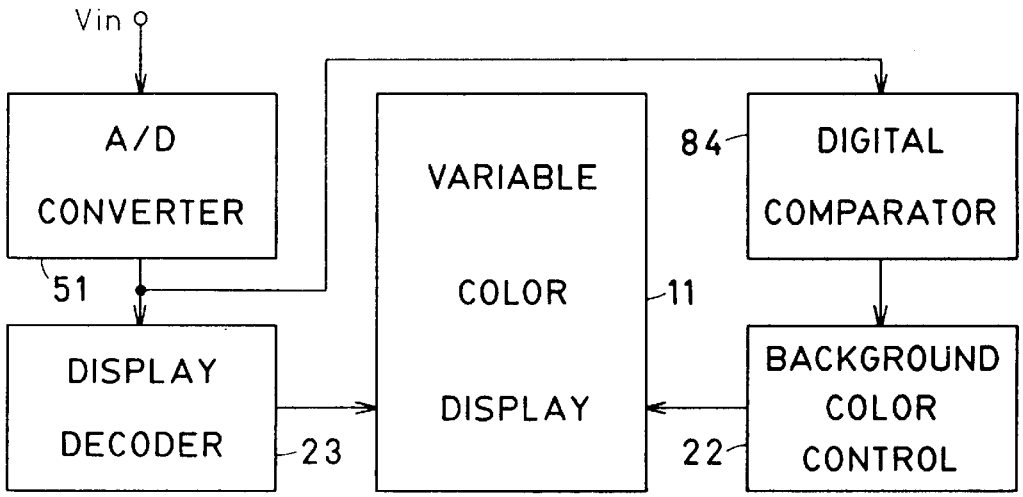
FIG. 3 is a block diagram of a variable color digital voltmeter with a digital comparator.

In FIG. 3 is shown a block diagram of a like digital voltmeter characterized by a digital comparator 84. The input of digital comparator 84 is coupled to the output of A/D converter 51 for comparing the output digital data with predetermined limits and for developing comparison signals accordingly. The background color control 22 illuminates the background area of display 11 in accordance with the comparison signals.

Figure 4:
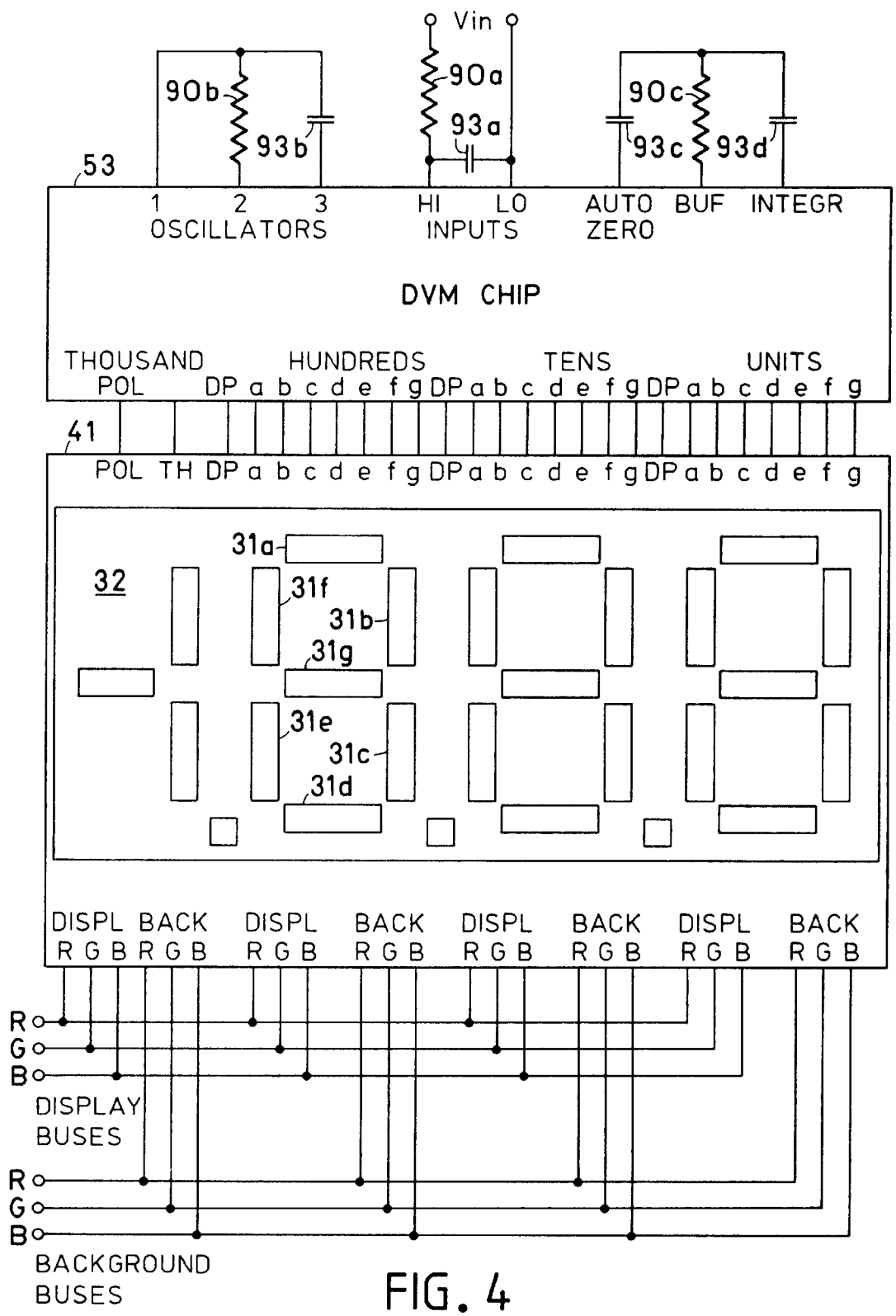
FIG. 4 is a simplified schematic diagram of a digital voltmeter of the invention.

In FIG. 4 is shown a schematic diagram of a digital voltmeter of this invention which includes a DVM (digital voltmeter) chip 53 for measuring input signal Vin applied, via a resistor 90a and decoupling capacitor 93a, to its HI (high) and LO (low) inputs, and for developing segment drive signals a, b, c, d, e, f, g, and DP (decimal point) for a 3 ½ digit variable color display 41 on which measured values of the input signal may be indicated in a character format. Resistor 90b and capacitor 93b, coupled to input OSCILLATORS, are provided for selecting a suitable frequency of internal oscillators. An auto zero capacitor 93c tends to decrease noise. Integrating capacitor 93d and buffer resistor 90c provide desired voltage swing and linearity.

The first display element of the display 41 consists of a figure '1' and a minus sign. The second, third, and fourth display elements consist of seven segments arranged in a well known 7-segment font on which selected characters may be exhibited in variable color. In the second display element, the segments are designated as 31a, 31b, 31c, 31d, 31e, 31f, and 31g. Each display element has three color control inputs R (red), G (green), and B (blue) designated DISPL. Each display element is surrounded by a variable color background area, as will be more clearly pointed out subsequently. The background area of each display element also has three color control inputs R, G, and B designated as BACK. It is obvious from the illustration that the color control inputs of the display elements and background areas are respectively interconnected to form DISPLAY BUSES R, G, and B, for uniformly controlling color of all display elements, and BACKGROUND BUSES R, G, and B, for uniformly controlling color of the entire background area 32.

Figure 5:
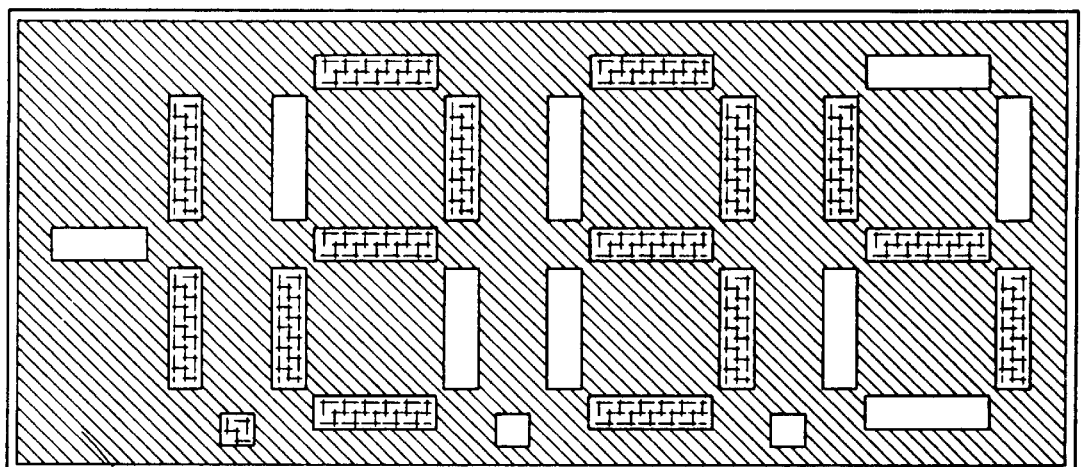
FIG. 5 is an exemplary detail of the display on which measured result is displayed in yellow color on green background.
Figure 6:
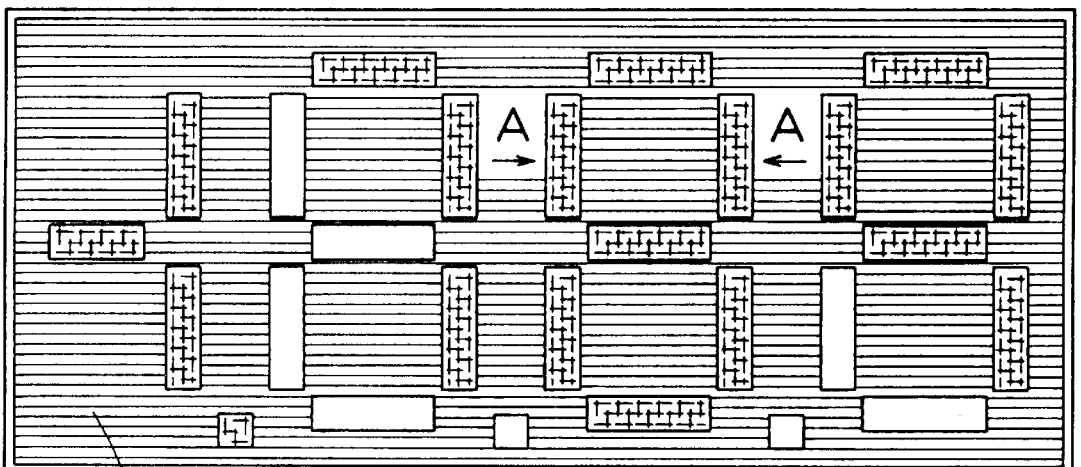
FIG. 6 is a similar detail of the display on which measured result is displayed in yellow color on blue background.
Figure 7:
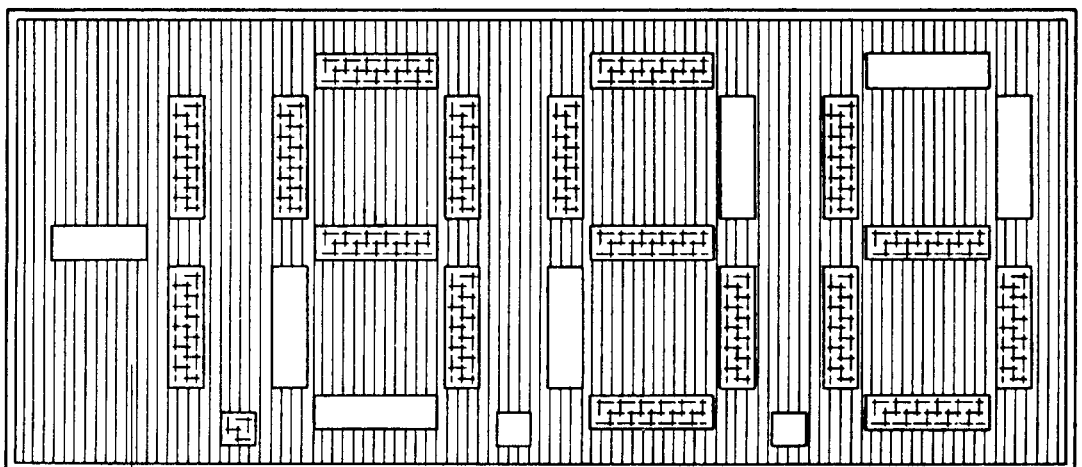
FIG. 7 is a similar detail of the display on which measured result is displayed in yellow color on red background.

FIGS. 5 to 7 are examples of displayed measured values which consider exemplary low limit −1.5 and high limit 1.5 (in Volts or in any other suitable units). The invention resides in controlling the color of background area 32 to indicate whether the measured value lies within the bounds of the low and high limits, below the low limit, or above the high limit. FIG. 5 shows display 41 on which a measured value 1.234 is displayed on green background, to indicate that it lies within the bounds of the low and high limits. FIG. 6 shows display 41 on which a measured value −1.789 is displayed on blue background, to indicate that it lies below the low limit. FIG. 7 shows display 41 on which a measured value 1.956 is displayed on red background, to indicate that it lies above the high limit. To render the illustration less complex, all measured values are displayed in yellow color. It will be appreciated that the color of the display areas may be also varied, to enhance the presentation, as will be pointed out subsequently.

It is readily apparent that the method of displaying measured values shown in FIGS. 5 to 7 is extremely advantageous. Being completely surrounded by background area 32, all display elements in display 41 are effectively associated therewith. It is perfectly clear that the color of background area 32 relates to the values exhibited on the display elements within its boundaries, and not to values exhibited on display elements which may be located outside the boundaries.

Figure 8:
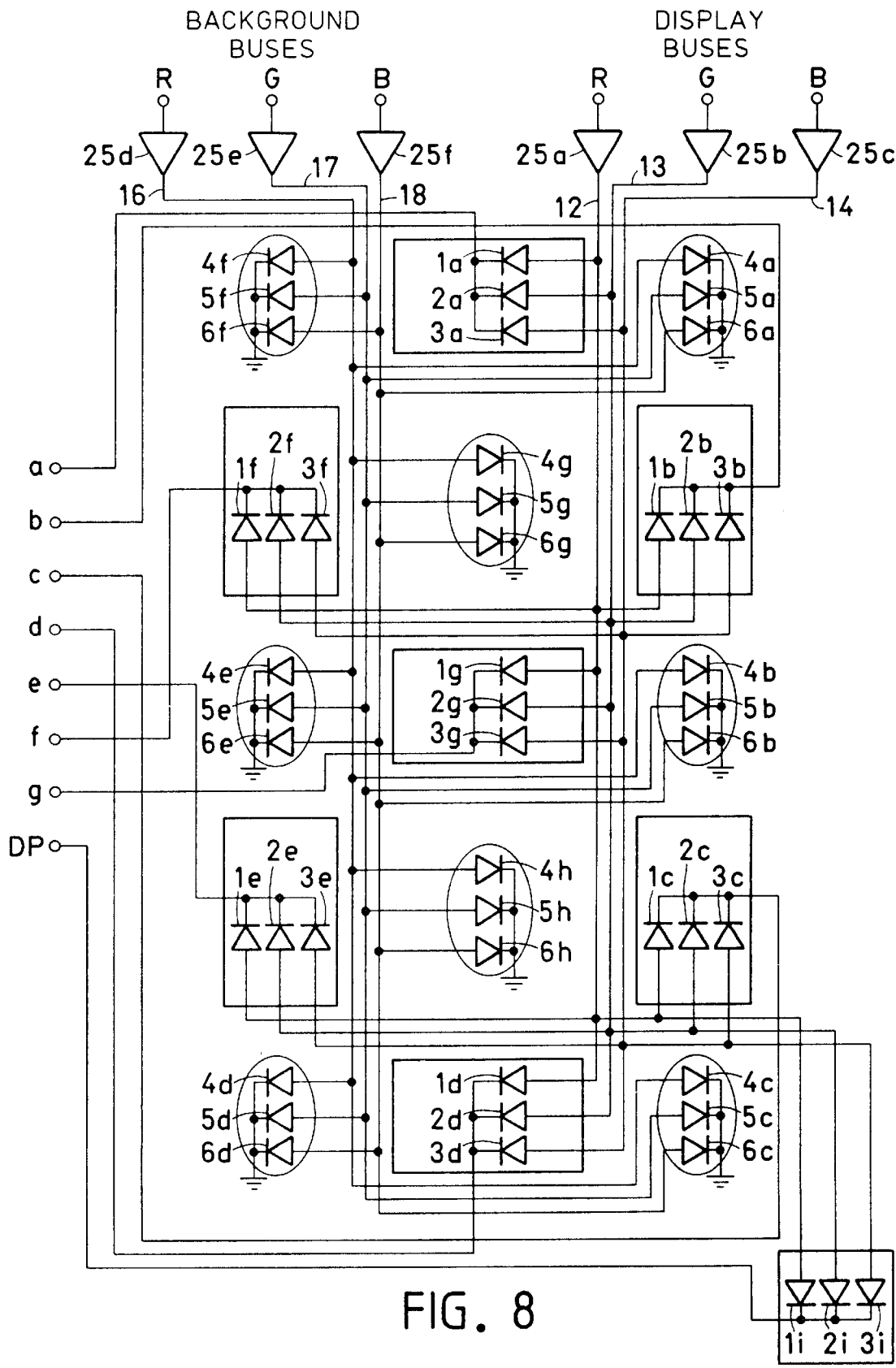
FIG. 8 is a simplified schematic diagram of one element of a variable color display device.

Proceeding now to the detailed description, in FIG. 8 is shown a simplified schematic diagram of a one-character 7-segment variable color display element with variable color background. Each display segment of the display element includes a triad of closely adjacent LEDs: a red LED 1, green LED 2, and blue LED 3 which are adapted for producing a composite light signal of a variable color. To facilitate the illustration, the LEDs are designated by segment letters, e. g., red LED in the segment b is shown at 1b, green LED in the segment d is shown at 2d, and blue LED in the segment f is shown at 3f. The background area is comprised of background regions adjacent the display segments. Each background region includes a triad of closely adjacent LEDs: a red LED 4, green LED 5, and blue LED 6 which are adapted for producing a composite light signal of a variable color. As much as possible, the LEDs in the background regions are designated by letters of adjacent display segments.

The cathodes of all red, green, and blue display LED triads are interconnected in each display segment and electrically connected to respective inputs a, b, c, d, e, f, g, and DP (decimal point) which may be coupled to the outputs of DVM chip 53 viewed in FIG. 4. The anodes of all display red LEDs 1a, 1b, 1c, 1d, 1e, 1f, 1g, and 1i are commonly coupled to an electric path referred to as a display red bus 12. The anodes of all display green LEDs 2a, 2b, 2c, 2d, 2e, 2f, 2g, and 2i are commonly coupled to a like electric path referred to as a display green bus 13. The anodes of all display blue LEDs 3a, 3b, 3c, 3d, 3e, 3f, 3g, and 3i are commonly coupled to a like electric path referred to as a display blue bus 14.

In a similar fashion, the anodes of all background red LEDs 4a, 4b, 4c, 4d, 4e, 4f, 4g, and 4h are commonly coupled to an electric path referred to as a background red bus 16. The anodes of all background green LEDs 5a, 5b, 5c, 5d, 5e, 5f, 5g, and 5h are commonly coupled to a like electric path referred to as a background green bus 17. The anodes of all background blue LEDs 6a, 6b, 6c, 6d, 6e, 6f, 6g, and 6h are commonly coupled to a like electric path referred to as a background blue bus 18. The cathodes of all red, green, and blue LED triads in each background region are grounded.

The display red bus 12 is connected to the output of a non-inverting buffer 25a capable of sourcing sufficient current to illuminate all display red LEDs. The display green bus 13 is connected to the output of a like buffer 25b. The display blue bus 14 is connected to the output of a like buffer 25c. The background red bus 16 is connected to the output of a like buffer 25d. The background green bus 17 is connected to the output of a like buffer 25e. The background blue bus 18 is connected to the output of a like buffer 25f. It would be obvious to those skilled in the art that current limiting resistors may be connected in series with all LEDs in the circuit to constrain current flow. The operation of the display element shown in FIG. 4 will be now explained by the example of illuminating digit '1' in yellow color. To exhibit decimal number '1', low voltage levels are applied to the inputs b and c, to illuminate equally designated segments, and high voltage levels are applied to all remaining inputs a, d, e, f, g, and DP, to extinguish all remaining segments.

To illuminate the display element in yellow color, the color control inputs R and G of the display buses are raised to a high logic level, while color control input B is maintained at a low logic level. As a result, the outputs of buffers 25a and 25b rise to a high logic level. The current flows from the output of buffer 25a, via display red bus 12 and red LED 1b, to the input b, and, via red LED 1c, to the input c. The current also flows from the output of buffer 25b, via display green bus 13 and green LED 2b, to the input b, and, via green LED 2c, to the input c. As a result of blending light signals of red and green colors in the segments b and c, the segments illuminate in substantially yellow color, creating a visual impression of a character '1'.

To illuminate the background area in green color, the color control input G of the background buses is raised to a high logic level, while the remaining color control inputs R and B are low. As a result, the output of buffer 25e rises to a high logic level. The current flows therefrom, via background green bus 17 and green LEDs 5a, 5b, 5c, 5d, 5e, 5f, 5g, and 5h in all background regions, to ground. The entire background area illuminates in green color.

To illuminate the background area in blue color, the color control input B of the background buses is raised to a high logic level, while the remaining color control inputs R and G are low. As a result, the output of buffer 25f rises to a high logic level. The current flows therefrom, via background blue bus 18 and blue LEDs 6a, 6b, 6c, 6d, 6e, 6f, 6g, and 6h in all background regions, to ground. The entire background area illuminates in blue color.

To illuminate the background area in red color, the color control input R of the background buses is raised to a high logic level, while the remaining color control inputs G and B are low. As a result, the output of buffer 25d rises to a high logic level. The current flows therefrom, via background red bus 16 and red LEDs 4a, 4b, 4c, 4d, 4e, 4f, 4g, and 4h in all background regions, to ground. The entire background area illuminates in red color.

To illuminate the background area in a composite color, a selective combination of logic level signals may be applied to the background color control inputs R, G, and B. As a result of the blending of the selected primary colors in the background area, as illustrated in detail in FIG. 9, the entire background area illuminates in a composite color determined by the input color code.

Figure 9:
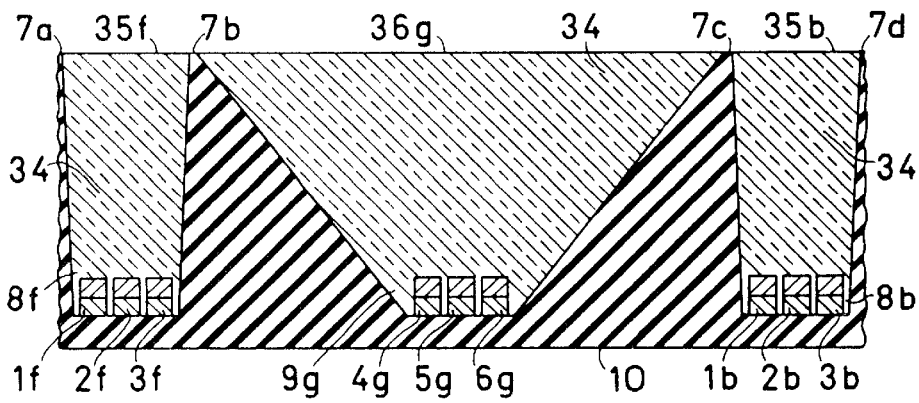
FIG. 9 is a cross-sectional view, taken along the line A—A in FIG. 6, revealing internal structure of a portion of a variable color display device.

An important consideration has been given to physical arrangement of the LEDs in the display areas and background regions, as illustrated in FIG. 9. Display red LED 1f, green LED 2f, and blue LED 3f are disposed on a support 10 in a display light blending cavity 8f and completely surrounded by a transparent light scattering material 34. When forwardly biased, LEDs 1f, 2f, and 3f emit light signals of red, green, and blue colors, respectively, which are blended by passing through light scattering material 34, acting to disperse the light signals, to form a composite light signal that emerges at the upper surface 35f. The color of the composite light signal may be controlled by varying the portions of red, green, and blue light signals. Display red LED 1b, green LED 2b, and blue LED 3b are similarly disposed in a display light blending cavity 8b and may be similarly activated.

In a similar fashion, background red LED 4g, green LED 5g, and blue LED 6g are disposed on support 10 in a background light blending cavity 9g and surrounded by transparent light scattering material 34. When forwardly biased, LEDs 4g, 5g, and 6g emit light signals of red, green, and blue colors, respectively, which are blended by passing through light scattering material 34 to form a composite light signal of a composite color that emerges at the upper surface 36g.

The display light blending cavities are optically separated from adjacent background light blending cavities by opaque walls. The display light blending cavity 8f is defined by walls 7a and 7b which have generally smooth inclined surfaces defining an obtuse angle with support 10. The walls 7b and 7c similarly define a background light blending cavity 9g therebetween. In a similar fashion, display light blending cavity 8b is defined by the 7c and 7d. The width of the top surfaces of the opaque walls is uniform and distinctly less than the width of the display areas or background regions so as to minimize the boundaries therebetween. The top surfaces of the opaque walls and top surfaces of the display areas and background regions are in the same plane to allow wide angle observation of the display device. Although the walls and light blending cavities are shown to be of certain shapes and dimensions, it is envisioned that they may be modified and rearranged.

Figure 10:
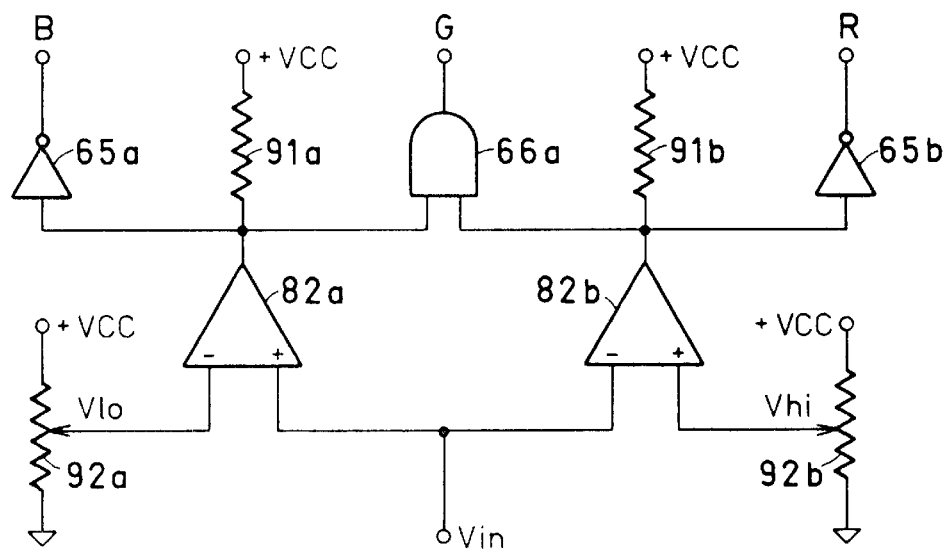
FIG. 10 is a schematic diagram of an analog comparator for developing color control signals.

In FIG. 10, the input signal Vin is applied to the interconnected inputs of two analog comparators 82a, 82b in a classic 'window' comparator configuration. When the input voltage is lower than the low voltage limit Vlo, set by a potentiometer 92a, the output of analog comparator 82a drops to a low logic level, thereby forcing the output of an inverter 65a to rise to a high logic level to develop active color control signal B.

When the input voltage is higher than the high voltage limit Vhi, set by a potentiometer 92b, the output of analog comparator 82b drops to a low logic level, thereby forcing the output of an inverter 65b to rise to a high logic level to develop active color control signal R.

When the input voltage is between the low voltage limit Vlo and the high voltage limit Vhi, the outputs of analog comparators 82a, 82b rise to a high logic level (pull-up resistors 91a, 91b ensure correct high and low levels), thereby causing the output of AND gate 66 to rise to a high logic level to develop active color control signal G.

The outputs B, G, and R may be respectively coupled to like inputs B, G, and R of the background buses in FIG. 4 for illuminating background area 32 in a color in accordance with the range in which the measured voltage lies. Alternatively, the outputs B, G, and R may be respectively coupled to like inputs B, G, and R of the display buses in FIG. 4 for illuminating display areas 31a to 31f of all display elements in display 41 in a color in accordance with the range in which the measured voltage lies.

Figure 11:
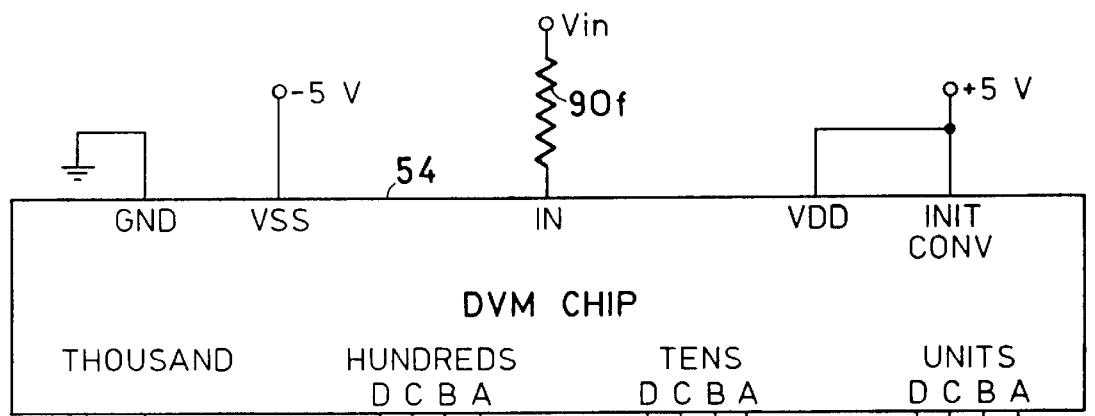
FIG. 11 is a schematic diagram of a digital comparator for developing color control signals.
Figure 11:
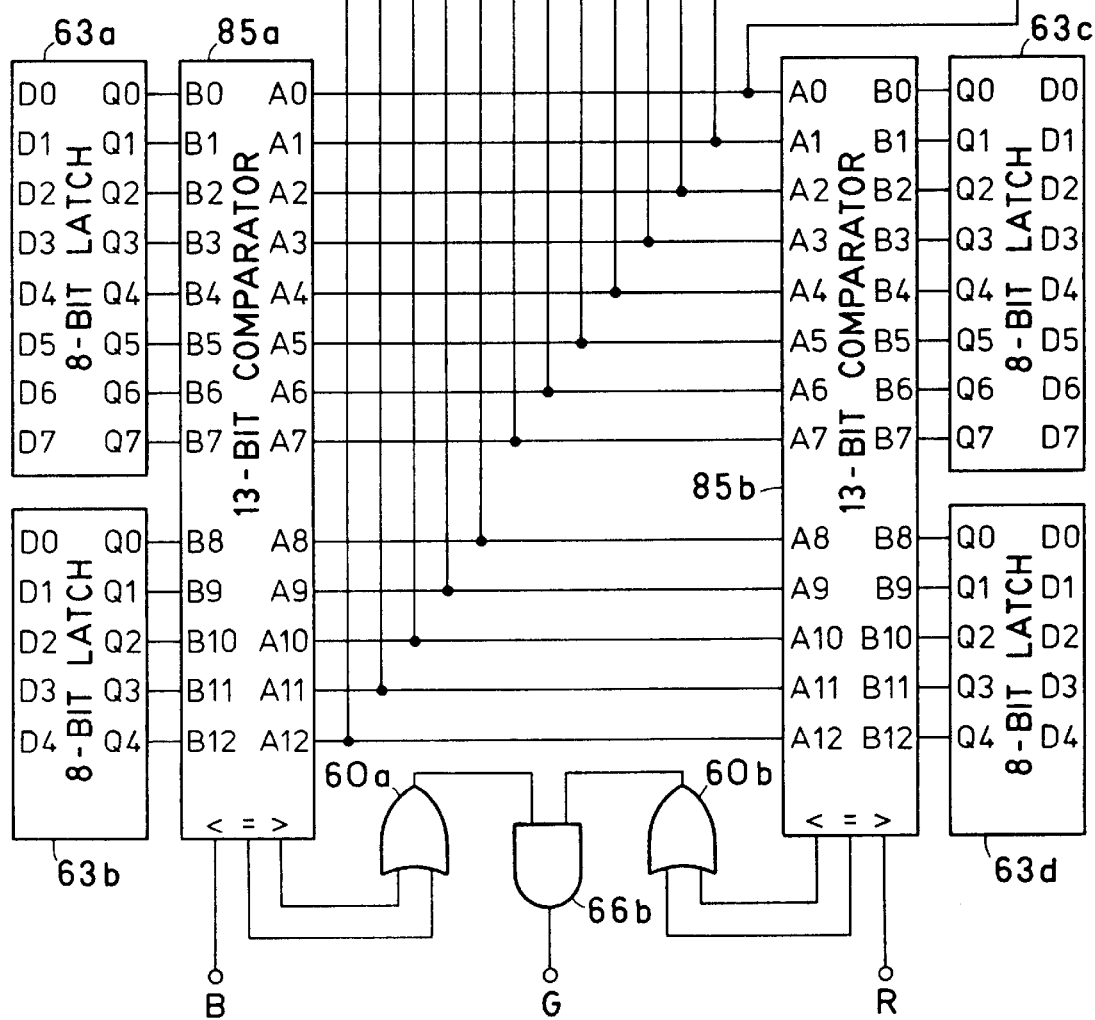

In FIG. 11 is shown a schematic diagram of a digital voltmeter with a digital comparator for developing color control signals. A DVM chip 54 measures an input signal Vin applied via a resistor 90f to its input IN and develops at its outputs A, B, C, and D of Units, Tens, Hundreds, and Thousand digital data corresponding to the value of the measured input signal. The input INIT CONV (initiate conversion) is tied to a high logic level for causing DVM chip 54 to measure continuously. The output digital data are simultaneously applied to the inputs A0 to A12 of a 13-bit digital comparator 85a and to the inputs A0 to A12 of a like digital comparator 85b. Two 8-bit latches 63a, having its outputs Q0 to Q7 respectively coupled to the inputs B0 to B7 of digital comparator 85a, and 63b, having its outputs Q0 to Q4 respectively coupled to the inputs B8 to B12 of digital comparator 85a, are provided for storing a digital representation of a low limit. Two like latches 63c, having its outputs Q0 to Q7 respectively coupled to the inputs B0 to B7 of digital comparator 85b, and 63d, having its outputs Q0 to Q4 respectively coupled to the inputs B8 to B12 of digital comparator 85b, are provided for storing a digital representation of a high limit. The digital comparator 85a compares the output digital data with the low limit and develops comparison signals accordingly. The digital comparator 85b compares the output digital data with the high limit and develops comparison signals accordingly. It would be obvious that measurement limits may be readily changed by clocking new data, representing new low limit and new high limit, into latches 63a to 63d (not shown).

When the output digital data of DVM chip 54 are less than the low limit, the output '<' of digital comparator 85a rises to a high logic level to generate an active color control signal B. When the output digital data are greater than the high limit, the output '>' of digital comparator 85b rises to a high logic level to generate an active color control signal R. When the output digital data are within the bounds of the low and high limits, one of the outputs '=' and '>' of digital comparator 85a, which are gated by an OR gate 60a, and one of the outputs '<' and '=' of digital comparator 85b, which are gated by an OR gate 60b, rise to a high logic level to force both inputs of an AND gate 66b to rise to a high logic level. As a consequence, the output of AND gate 66b rises to a high logic level to generate active color control signal G.

The comparison outputs B, G, and R may be respectively coupled to like inputs of the background buses in FIG. 4 for causing background area 32 of display 41 to illuminate either in blue color when the measured value is less than the low limit, in red color when the measured value is greater than the high limit, or in green color when the measured value is within the bounds of the low and high limits. Alternatively, the comparison outputs B, G, and R may be respectively coupled to like inputs B, G, and R of the display buses in FIG. 4 for causing display areas 31a to 31f of the display elements in display 41 to illuminate in a color in accordance with the relation of the measured value to the low limit and the high limit. It would be obvious that the color sequences could be readily changed by differently interconnecting the comparison outputs with the color control inputs.

Figure 12:
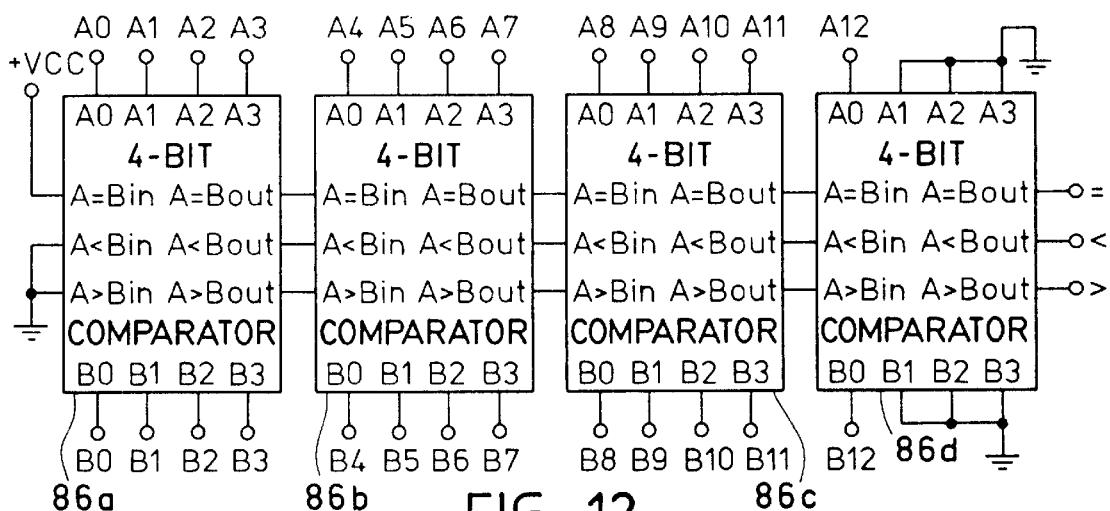
FIG. 12 is a detail of 13-bit digital comparator in FIG. 11.

FIG. 12 is a detail of one of 13-bit digital comparators 85a, 85b in FIG. 11. It will be appreciated that both digital comparators 85a, 85b may be substantially same. The comparison inputs '<', '=', and '>' of four 4-bit digital comparators 86a, 86b, 86c, and 86d are respectively coupled to like preceding outputs, in a manner well understood by those skilled in the art, to extend the comparison range to 13 bits.

The invention may be now briefly summarized. A display device was disclosed that comprises a display area, for exhibiting a display unit, substantially surrounded by a variable color background area. The background area includes a plurality of light emitting diodes, for emitting light signals of different colors, arranged in a pattern and coupled to a color control input. When a color control signal is applied to the color control input, the light emitting diodes are selectively biased to illuminate the background area in a selective uniform color.

The term "variable color background area", as used throughout the description of the present invention, should be interpreted broadly as any background area capable of being illuminated in a selective color.

It would be obvious that persons skilled in the art may resort to modifications in the construction of the preferred embodiments shown herein, without departing from the scope, as defined in the appended claims, and the spirit of the invention. It is contemplated that the principles of the invention may be also applied to numerous diverse types of display devices, such as liquid crystal devices, plasma devices, luminescent devices, cathode ray tube devices, and the like.

It is envisioned that those skilled in the art may, in the view of this disclosure, substitute a display device disclosed herein for a commercially available display in a device such as a timepiece, a computer, a typewriter, a measuring or testing device, a telecommunication device, a telephone, a pictorial communication device, television, an education or demonstration device, an amusement device, a sign exhibiting device, or the like, in order to obtain in such device certain of, or all, the novel features described herein.

CORRELATION TABLE

This is a correlation table of reference characters, their description, and example of commercially available parts

| # | DESCRIPTION | EXAMPLE |
|---|---|---|
| 1 | display red LED | |
| 2 | display green LED | |
| 3 | display blue LED | |
| 4 | background red LED | |
| 5 | background green LED | |
| 6 | background blue LED | |
| 7 | opaque wall | |
| 8 | display light blending cavity | |
| 9 | background light blending cavity | |
| 10 | support | |
| 11 | variable color display | |
| 12 | display red bus | |
| 13 | display green bus | |
| 14 | dispaly blue bus | |
| 16 | background red bus | |
| 17 | background green bus | |
| 18 | background blue bus | |
| 21 | segment color control | |
| 22 | background color control | |
| 23 | display decoder | |
| 25 | non-inverting buffer | |
| 31 | display segment | |
| 32 | background area | |
| 34 | light scsttering material | |
| 35 | top surface of display area | |
| 36 | top surface of background area | |
| 41 | 3 1/2 digit variable color display | |
| 51 | A/D converter | |
| 53 | Teledyne DVM chip | TSC7107 |
| 54 | Teledyne DVM chip | TSC8750 |
| 60 | 2-inout OR gate | 74HC32 |
| 63 | 8-bit latch | 74HC373 |
| 65 | inverter | 74HC04 |
| 66 | 2-input AND gate | 74HC08 |
| 81 | analog comparator | |

CORRELATION TABLE-continued

This is a correlation table of reference characters, their
description, and example of commercially available parts

| # | DESCRIPTION | EXAMPLE |
|---|---|---|
| 82 | analog comparator chip | LM339 |
| 84 | digital comparator | |
| 85 | 13-bit digital comparator | |
| 86 | 4-bit digital comparator | 74HC85 |
| 90 | resistor | |
| 91 | resistor | |
| 92 | potentiometer | |
| 93 | capacitor | |

What I claim is:

1. A multicolor display device comprising:

a light emitting diode display area;

means for selectively illuminating said display area;

a background area substantially surrounding said display area, said background area including a plurality of light emitting diodes arranged in groups, each said group including a first light emitting diode for emitting, when forwardly biased, light signals of a first color, a second light emitting diode for emitting, when forwardly biased, light signals of a second color, a third light emitting diode for emitting, when forwardly biased, light signals of a third color, and means for combining said light signals in said group to obtain a light signal of a composite color, each of said first, second, and third light emitting diodes having a first electrode and a second electrode, all said first electrodes being of the same polarity and opposite the polarity of all said second electrodes;

said first electrodes of all said first light emitting diodes being commonly coupled to a first common path;

said first electrodes of all said second light emitting diodes being commonly coupled to a second common path;

said first electrodes of all said third light emitting diodes being commonly coupled to a third common path;

said second electrodes of all said first light emitting diodes, all said second light emitting diodes, and all said third light emitting diodes being commonly coupled to a return common path;

a first biasing device disposed between said first common path and said return common path, for forwardly biasing all said first light emitting diodes when said first biasing device is activated, and for not forwardly biasing said first light emitting diodes when said first biasing device is not activated;

a second biasing device disposed between said second common path and said return common path, for forwardly biasing all said second light emitting diodes when said second biasing device is activated, and for not forwardly biasing said second light emitting diodes when said second biasing device is not activated;

a third biasing device disposed between said third common path and said return common path, for forwardly biasing all said third light emitting diodes when said third biasing device is activated, and for not forwardly biasing said third light emitting diodes when said third biasing device is not activated;

a background color control for simultaneously activating said first biasing device, said second biasing device, and said third biasing device in selective combinations, for illuminating said background area in a selective composite color.

2. Multicolor display device comprising:

a light emitting diode display area;

means for selectively illuminating said display area;

a background area substantially surrounding said display area, said background area including a plurality of light emitting diodes arranged in groups, each said group including a first light emitting diode for emitting, when forwardly biased, light signals of a first color, a second light emitting diode for emitting, when forwardly biased, light signals of a second color, a third light emitting diode for emitting, when forwardly biased, light signals of a third color, and means for combining said light signals in said group to obtain a light signal of a composite color, each of said first, second, and third light emitting diodes having a first electrode and a second electrode, all said first electrodes being of the same polarity and opposite the polarity of all said second electrodes;

said first electrodes of all said first light emitting diodes being commonly coupled to a first common path;

said first electrodes of all said second light emitting diodes being commonly coupled to a second common path;

said first electrodes of all said third light emitting diodes being commonly coupled to a third common path;

said second electrodes of all said first light emitting diodes, all said second light emitting diodes, and all said third light emitting diodes being commonly coupled to a return common path;

a first biasing device disposed between said first common path and said return common path, for forwardly biasing all said first light emitting diodes when said first biasing device is activated, and for not forwardly biasing said first light emitting diodes when said first biasing device is not activated;

a second biasing device disposed between said second common path and said return common path, for forwardly biasing all said second light emitting diodes when said second biasing device is activated, and for not forwardly biasing said second light emitting diodes when said second biasing device is not activated;

a third biasing device disposed between said third common path and said return common path, for forwardly biasing all said third light emitting diodes when said third biasing device is activated, and for not forwardly biasing said third light emitting diodes when said third biasing device is not activated;

a background color control including a first control input for receiving an active input signal and an inactive input signal, a second control input for receiving an active input signal and an inactive input signal, and a third control input for receiving an active input signal and an inactive input signal, said background color control further including a first control output, associated with said first control input, a second control output, associated with said second control input, and a third control output, associated with said third control input, said first control output being coupled for activating said first biasing device in response to the active input signal at said first control input, said second control output being coupled for activating said second biasing device in response to the active input signal at said second control input, and said third control output being coupled for activating said third biasing device in response to the active input signal at said third control input;

wherein said input signals are simultaneously presented to said first control input, to said second control input, and to said third control input such that at least two of said input signals are active, for causing said background area to illuminate in a selective composite color.

3. In a multicolor display device, which includes a light emitting diode display area substantially surrounded by a variable color light emitting diode background area, the combination comprising:

a plurality of light emitting diodes positioned in said background area and arranged in groups, each said group including a first light emitting diode for emitting, when forwardly biased, light signals of a first color, a second light emitting diode for emitting, when forwardly biased, light signals of a second color, a third light emitting diode for emitting, when forwardly biased, light signals of a third color, and means for combining said light signals in said group to obtain a light signal of a composite color, each said light emitting diode having a first electrode of a predetermined polarity and a second electrode of an opposite polarity;

said first electrodes of all said first light emitting diodes being commonly coupled to a first common path;

said first electrodes of all said second light emitting diodes being commonly coupled to a second common path;

said first electrodes of all said third light emitting diodes being commonly coupled to a third common path;

said second electrodes of all said first light emitting diodes, all said second light emitting diodes, and all said third light emitting diodes being commonly coupled to a return common path;

a first biasing device disposed between said first common path and said return common path, for forwardly biasing all said first light emitting diodes when said first biasing device is activated, and for not forwardly biasing said first light emitting diodes when said first biasing device is not activated;

a second biasing device disposed between said second common path and said return common path, for forwardly biasing all said second light emitting diodes when said second biasing device is activated, and for not forwardly biasing said second light emitting diodes when said second biasing device is not activated;

a third biasing device disposed between said third common path and said return common path, for forwardly biasing all said third light emitting diodes when said third biasing device is activated, and for not forwardly biasing said third light emitting diodes when said third biasing device is not activated;

a background color control including a first control input for receiving an active input signal and an inactive input signal, a second control input for receiving an active input signal and an inactive input signal, and a third control input for receiving an active input signal and an inactive input signal, said background color control further including a first control output, associated with said first control input, a second control output, associated with said second control input, and a third control output, associated with said third control input, said first control output being coupled for activating said first biasing device in response to the active input signal at said first control input, said second control output being coupled for activating said second biasing device in response to the active input signal at said second control input, and said third control output being coupled for activating said third biasing device in response to the active input signal at said third control input;

wherein said input signals are simultaneously presented to said first control input, to said second control input, and to said third control input such that at least two of said input signals are active, for causing said background area to illuminate in a selective composite color.

\* \* \* \* \*